(12) United States Patent
Ashikaga (10) Patent No.: US 6,987,687 B2
(45) Date of Patent: Jan. 17, 2006

(54) SEMICONDUCTOR MEMORY AND ITS DRIVING METHOD

(75) Inventor: Kinya Ashikaga, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/715,524

(22) Filed: Nov. 19, 2003

(65) Prior Publication Data

US 2004/0100813 A1 May 27, 2004

Related U.S. Application Data

(62) Division of application No. 10/290,188, filed on Nov. 8, 2002, now Pat. No. 6,707,701, which is a division of application No. 09/943,513, filed on Aug. 31, 2001, now Pat. No. 6,501,674.

(30) Foreign Application Priority Data

Mar. 13, 2001 (JP) .................................. 2001-069606

(51) Int. Cl.
*G11C 11/22* (2006.01)
*G11C 11/42* (2006.01)
*G11C 5/06* (2006.01)
*G11C 7/00* (2006.01)
*G11C 7/02* (2006.01)

(52) U.S. Cl. .......................... 365/145; 365/65; 365/72; 365/189.07; 365/207

(58) Field of Classification Search ................ 365/145, 365/65, 72, 189.07, 207, 154
See application file for complete search history.

(56) References Cited

U.S. PATENT DOCUMENTS

| | | |
|---|---|---|
| 5,022,009 A | 6/1991 | Terada et al. |
| 5,297,077 A | 3/1994 | Imai et al. |
| 5,517,445 A | 5/1996 | Imai et al. |
| 5,615,145 A | 3/1997 | Takeuchi et al. |
| 5,694,353 A | 12/1997 | Koike |
| 5,926,413 A | 7/1999 | Yamada et al. |
| 6,151,242 A | 11/2000 | Takashima |
| 6,154,402 A | 11/2000 | Akita |
| 6,154,405 A | 11/2000 | Takemae et al. |
| RE36,993 E | 12/2000 | Takashima et al. |
| 6,407,943 B1 | 6/2002 | Choi et al. |

FOREIGN PATENT DOCUMENTS

JP          07-093978          4/1995

*Primary Examiner*—David Nelms
*Assistant Examiner*—Ly Duy Pham
(74) *Attorney, Agent, or Firm*—Volentine Francos & Whitt PLLC (57) ABSTRACT

A ferroelectric memory of a 1T/1C type has a pair of dummy memory cells DMC2$n$–1 and DMC2$n$. Different information have been stored in the dummy memory cells. When the information is read, out from each dummy memory cell, a potential Va is developed on a bit line BL2$n$–1, a potential Vb is developed on an adjacent bit line BL2$n$. Since the bit lines BL2$n$–1 and BL2$n$ have the same capacitance, a potential Vave of each bit line which was short-circuited by a short-circuit portion s2$a$ is equal to a just intermediate value (Va+Vb)/2 of the potentials Va and Vb. The potential Vave is applied to sense amplifiers SA$n$–1 and SA$n$ as a reference potential.

12 Claims, 5 Drawing Sheets

SEMICONDUCTOR MEMORY AND ITS DRIVING METHOD

This is a divisional of U.S. patent application Ser. No. 10/290,188, filed Nov. 8, 2002 now U.S. pat. No. 6,707,701, which is a divisional of U.S. patent application Ser. No. 09/943,513, filed Aug. 31, 2001, issued as U.S. Pat. No. 6,501,674 on Dec. 12, 2002, the entire contents of each of which are hereby incorporated herein by reference for all purposes as if fully set forth herein.

BACKGROUND OF THE INVENTION

1. Field of the Invention

The invention relates to a semiconductor memory and a driving method of a semiconductor memory. More particularly, the invention relates to a semiconductor memory having a ferroelectric capacitor and a driving method of such a memory.

2. Related Background Art

In recent years, an interest in a memory using a ferroelectric substance as a capacitor dielectric film (hereinafter, such a memory is referred to as a "ferroelectric memory") is increasing more and more. The ferroelectric memory stores information by using a spontaneous polarization of a ferroelectric substance. When a polarizing direction is oriented to one direction by once applying a voltage to the ferroelectric capacitor, the polarization remains (referred to as a "residual polarization") even if no electric power is supplied after that, and the stored information is held. The ferroelectric memory having such a feature can be used as a non-volatile memory.

Further, in case of a general volatile memory such as a DRAM or the like, a voltage of 10V or more is necessary for writing data. According to the ferroelectric memory, a polarizing direction of the ferroelectric capacitor is reversed by a voltage of a few volts and data can be written. A data writing time of the general non-volatile memory is on the order of microseconds. A polarization reversing time of the ferroelectric memory is on the order of nanoseconds. As mentioned above, the ferroelectric memory is largely expected as a non-volatile memory of the next generation in which the operation of a low voltage and a high speed can be executed.

At present, a ferroelectric memory having a plurality of memory cells comprising MOS transistors (selective transistors) each of which functions as a switching device and ferroelectric capacitors mainly becomes a target of study and development. A construction and the operation of the memory cells of the ferroelectric memory will now be described with reference to FIG. 5.

In case of writing data into a memory cell MC, a word line WL is asserted and a selective transistor Tr is turned on. 0 v is applied to a bit line BL and a positive voltage is applied to a plate line PL. Thus, a polarization of a ferroelectric capacitor C is directed to one direction (↑ direction) shown in FIG. 5 and it is stored as information of, for example, "1" into the memory cell MC. On the contrary, when a positive voltage is applied to the bit line BL and 0V is applied to the plate line PL, the polarization of the ferroelectric capacitor C is directed to the direction (↓ direction) opposite to the above one direction and it is stored as information of, for example, "0" into the memory cell MC.

Figure 5:
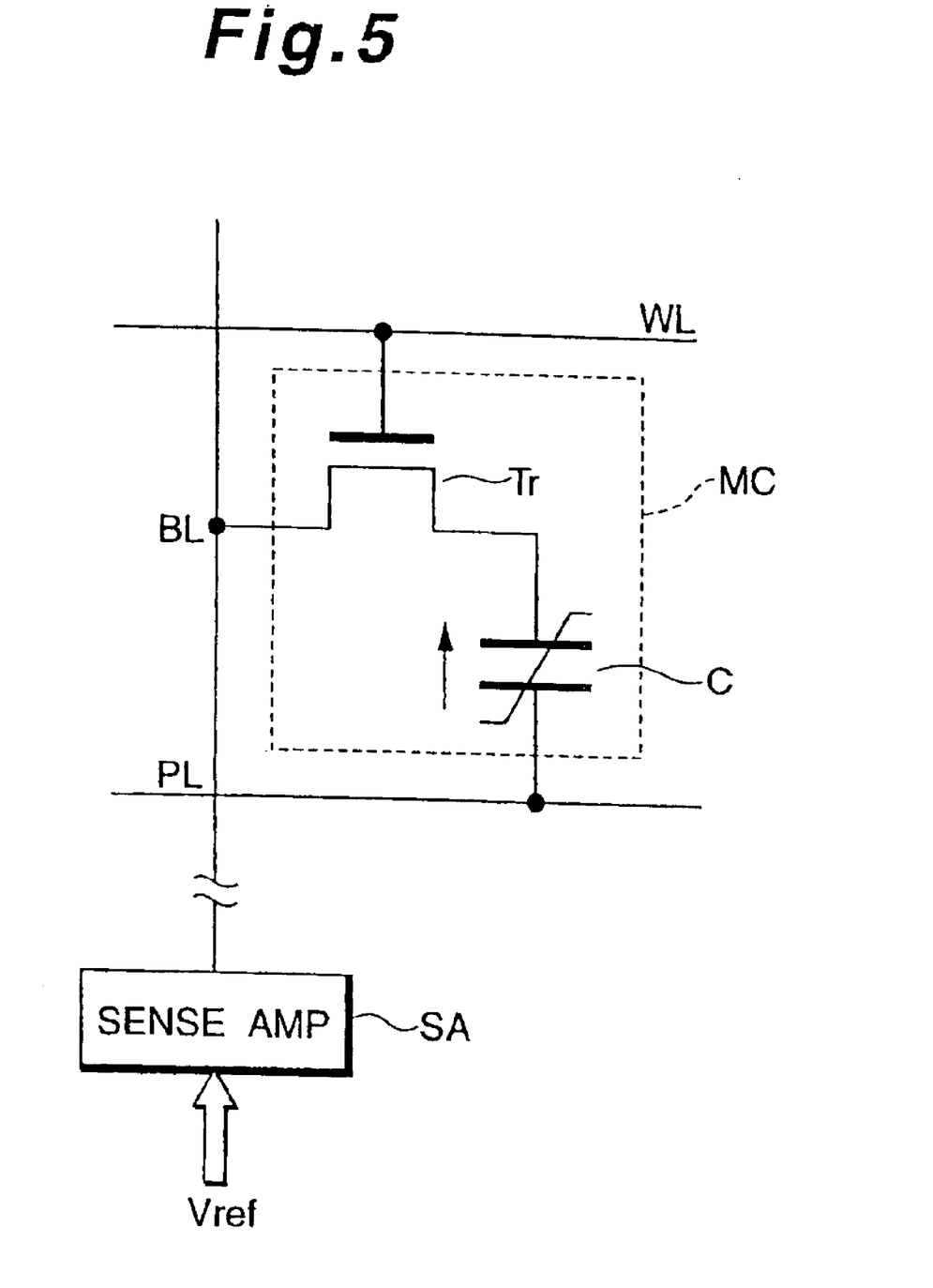
FIG. 5 is a circuit diagram showing a memory cell construction of a general ferroelectric memory.

In case of reading out the information from the memory cell MC, the bit line BL is precharged to 0V and a positive voltage is applied to the plate line PL. If the ferroelectric capacitor C has already been polarized in the opposite direction (↓ direction) (the information "0" has been held), the polarizing direction is reversed. On the other hand, if the ferroelectric capacitor C has already been polarized in one direction (↑ direction) (the information "1" has been held), the polarizing direction is not reversed. An electric potential of the bit line BL changes in accordance with the polarizing state of the ferroelectric capacitor C. Therefore, by detecting and amplifying a change amount of the electric potential of the bit line BL by a sense amplifier SA connected to the bit line BL, the information stored in the memory cell MC is read out.

The sense amplifier SA amplifies the electric potential of the bit line BL to either the L (low) level (for example, 0V) or the H (high) level (for example, a power potential Vcc) by using a reference potential Vref as a reference.

Generally, a dummy memory cell (not shown) in which information opposite to that in the memory cell MC is stored is provided for the ferroelectric memory. The reference potential Vref is inputted from the dummy memory cell to the sense amplifier SA. In this case, one information is stored by two memory cells in which complementary data is stored, respectively. Such a memory configuration is called a 2-transistor/2-capacitor (2T/2C) type.

As a memory configuration of the DRAM, a 1-transistor/1-capacitor (1T/1C) type in which one information is stored by one memory cell is used. According to the memory of the 1T/1C type, as compared with the 2T/2C type, since a layout area of a memory cell array is reduced, a large capacity of the memory can be easily realized.

The conventional ferroelectric memory having the memory array of the 1T/1C type has been disclosed in, for example, JP-A-7-93978. FIGS. 18(*a*) and 21 of this Official Gazette show circuit constructions of the conventional ferroelectric memory, and FIGS. 18(*b*) and 22 show the data reading operations thereof.

Although the 1T/1C type has a structural advantage as mentioned above, the use of it to the ferroelectric memory is not progressed due to the following reasons.

In case of the memory of the 1T/1C type, a circuit for generating the reference potential Vref is additionally necessary. In the ferroelectric memory, its circuit construction is more complicated than that of the DRAM.

In case of the DRAM, the bit line is set to ½ of the power voltage Vcc, the plate line is set to the power voltage Vcc or 0V, and data is written into the memory cell. After that, in order to read out the data, it is sufficient to precharge the bit line to ½ Vcc and activate the word line. An electric potential which is induced to the bit line is set to a voltage which is either higher or lower than ½ Vcc in accordance with the data stored in the memory cell. That is, in case of the DRAM, if ½ Vcc is used as a reference potential Vref, the stored data can be accurately read out.

Also in case of the ferroelectric memory as a target of the present invention, in a manner similar to the DRAM, an electric potential of the bit line during the data reading operation differs in dependence on contents of the data which is read out. Since an absolute value of the bit line potential differs in dependence on a variation of characteristics of the ferroelectric capacitor, it is not easy to decide such a value at the stage of design. Therefore, it is extremely difficult to generate the reference potential Vref adjusted to an intermediate value of two electric potentials which show a binary value and are induced on the bit line during the data reading operation, that is, an average value of the bit line potential in case of reading out the information "0" and the bit line potential in case of reading out the information "1".

Unless the reference potential Vref is accurately adjusted to the intermediate value of the two electric potentials induced on the bit line, there is also a possibility that the stored information is erroneously read out.

As mentioned above, hitherto, in case of using the memory array construction of the 1T/1C type for the ferroelectric memory, since the reliability of the data which is read out deteriorates, the memory construction of the 2T/2C type which is disadvantageous to realize a large capacity has to be used.

SUMMARY OF THE INVENTION

The invention is made in consideration of the above problems and it is an object of the invention to provide a ferroelectric memory from which stored information can be accurately read out and to provide a driving method of such a memory.

To accomplish the above object, according to the first aspect of the invention, there is provided a semiconductor memory comprising: a first sense amplifier which has a first terminal and a second terminal, compares an electric potential of the first terminal with an electric potential of the second terminal, and outputs an amplified voltage to each of the first and second terminals in accordance with a result of the comparison; a second sense amplifier which has a third terminal and a fourth terminal, compares an electric potential of the third terminal with an electric potential of the fourth terminal, and outputs an amplified voltage to each of the third and fourth terminals in accordance with a result of the comparison; a first bit line connected to the first terminal; a second bit line connected to the second terminal; a third bit line connected to the third terminal; a fourth bit line connected to the fourth terminal; a first memory cell which is connected to the first bit line and has a ferroelectric capacitor; a first dummy memory cell which is connected to the second bit line and has a ferroelectric capacitor polarized to a first direction; a second memory cell which is connected to the third bit line and has a ferroelectric capacitor; a second dummy memory cell which is connected to the fourth bit line and has a ferroelectric capacitor polarized to a second direction opposite to the first direction; and first short-circuit means which can short-circuit the second and fourth bit lines. It is preferable that the first and third bit lines belong to a first area and the second and fourth bit lines belong to a second area which does not overlap with the first area.

In the semiconductor memory of the invention, each of the first and second memory cells is used for storing data of one bit in the data which is stored in the semiconductor memory. Unlike the first and, second memory cells, the first and second dummy memory cells operate so that the ferroelectric capacitors are certainly polarized to the opposite directions. That is, if the first dummy memory cell stored, for example, information "0", the second dummy memory cell certainly stores information "1". Under this condition, by reading out the stored information from the first dummy memory cell, an electric potential according to the information "0" is induced on the second bit line. By reading out the stored information from the second dummy memory cell, an electric potential according to the information "1" is induced on the fourth bit line.

When the stored information is read out from the first dummy memory cell to the second bit line and the stored information is read out from the second dummy memory cell to the fourth bit line, if the second and fourth bit lines are short-circuited by the first short-circuit means, the electric potential of both bit lines is set to the intermediate value (average value) of the electric potentials of the bit lines before the short-circuit.

If the first memory cell, second memory cell, first dummy memory cell, and second dummy memory cell are formed in almost the same size, the electric potential of the short-circuited second and fourth bit lines coincides with an intermediate value (average value) of the electric potential of the first bit line (or the third bit line) at the time when the stored information "1" is read out from the first memory cell (or the second memory cell) and the electric potential of the first bit line (or the third bit line) at the time when the stored information "0" is read out from the first memory cell (or the second memory cell).

After the short-circuited second and fourth bit lines were released, if the electric potential of the second bit line (second terminal) and the electric potential of the first bit line (first terminal) which was changed by reading out the stored information from the first memory cell are amplified by the first sense amplifier, the stored information in the first memory cell is accurately outputted to the outside. Similarly, if the electric potential of the fourth bit line (fourth terminal) and the electric potential of the third bit line (third terminal) which was changed by reading out the stored information from the second memory cell are amplified by the second sense amplifier, the stored information in the second memory cell is accurately outputted to the outside. In this case, the electric potentials at the second and fourth terminals become the reference potential.

According to the invention, the first and third bit lines belong to the first area and the second and fourth bit lines belong to the second area which does not overlap with the first area. According to the above construction, a situation such that another bit line is arranged between the first and third bit lines and another bit line is arranged between the second and fourth bit lines is prevented. Therefore, the first and second short-circuit means for short-circuiting those bit lines can be also easily arranged.

The semiconductor memory can also further have: a third dummy memory cell which is connected to the first bit line and has a ferroelectric capacitor polarized to a third direction; a third memory cell which is connected to the second bit line and has a ferroelectric capacitor; a fourth dummy memory cell which is connected to the third bit line and has a ferroelectric capacitor polarized to a fourth direction opposite to the third direction; a fourth memory cell which is connected to the fourth bit line and has a ferroelectric capacitor; and a second short-circuit means which can short-circuit the first and third bit lines. According to the above construction, the stored information can be read out from the first and second memory cells at high precision and the stored information can be also read out from the third and fourth memory cells at high precision. In this case, the third and fourth dummy memory cells function as a generating source of the reference potential.

According to the second aspect of the invention, there is provided a driving method of a semiconductor memory, comprising: a first step of reading out information stored in a first memory cell and inducing a first electric potential onto a first bit line; a second step of reading out information stored in a first dummy memory cell having a ferroelectric capacitor polarized to a first direction and inducing a second electric potential onto a second bit line; a third step of reading out information stored in a second dummy memory cell having a ferroelectric capacitor polarized to a second direction opposite to the first direction and inducing a fourth electric potential onto a fourth bit line; a fourth step of short-circuiting the second and fourth bit lines by first short-circuit means after the third step; a fifth step of releasing the short-circuited second and fourth bit lines; and a sixth step of activating a first sense amplifier, comparing an electric potential of the first bit line with an electric potential of the second bit line and outputting an amplified voltage to each of the first and second bit lines in accordance with a result of the comparison.

By forming the first memory cell, first dummy memory cell, and second dummy memory cell in an almost same size, an electric potential of the short-circuited second and fourth bit lines coincides with an intermediate value (average value) of the electric potential of the first bit line at the time when stored information "1" is read out from the first memory cell and the electric potential of the first bit line at the time when stored information "0" is read out from the first memory cell. Therefore, the stored information in the first memory cell is accurately outputted to the outside.

Further, after the sixth step, it is preferable to execute: a seventh step of writing predetermined information into the first dummy memory cell so that the ferroelectric capacitor which the first dummy memory cell has is polarized to the second direction; and an eighth step of writing predetermined information into the second dummy memory cell so that the ferroelectric capacitor which the second dummy memory cell has is polarized to the first direction. By executing those steps, the polarizing direction of the ferroelectric capacitor which the first dummy memory cell has and the polarizing direction of the ferroelectric capacitor which the second dummy memory cell has are reversed from the initial states, so that the occurrence of an imprint phenomenon in the ferroelectric capacitor is prevented.

According to the third aspect of the invention, there is provided a semiconductor memory comprising: a memory cell having ferroelectric capacitors which can be connected to a first bit line through a switching device; a sense amplifier comparing an electric potential of the first bit line with a reference potential in order to read out data in the memory cell; first and second dummy memory cells having ferroelectric capacitors which can be connected to a second bit line and a third bit line through switching devices in order to apply the reference potential to the sense amplifier; and short-circuit means which short-circuits the second and third bit lines at the time of reading the data, wherein the ferroelectric capacitors of both of the dummy memory cells are mutually polarized to the opposite directions as storage information in the dummy memory cells, when the data is read out, the operation to apply the electric potentials from both of the dummy memory cells to each bit line corresponding thereto is executed in a state where both of the second and third bit lines are mutually electrically shut off, and thereafter, an intermediate value of both electric potentials of both of the second and third bit lines which is obtained by the short-circuit of both of the second and third bit lines by the short-circuit means is supplied as a reference potential to the sense amplifier.

Preferably, each time the data is read out, the polarizing directions of the ferroelectric capacitors of both of the dummy memory cells are sequentially reversed to the opposite directions.

According to the fourth aspect of the invention, there is provided a semiconductor memory comprising: a memory cell having ferroelectric capacitor which can be connected to a first bit line through a switching device; a sense amplifier comparing an electric potential of the first bit line with a reference potential in order to read out data in the memory cell; first and second dummy memory cells having ferroelectric capacitors which can be connected to a second bit line and a third bit line through switching devices in order to apply the reference potential to the sense amplifier; and short-circuit means which short-circuits the second and third bit lines at the time of reading the data, wherein the ferroelectric capacitors of both of the dummy memory cells are mutually polarized to the opposite directions as storage information in the dummy memory cells, and each time the data is read out, the polarizing directions of the ferroelectric capacitors of both of the dummy memory cells are sequentially reversed to the opposite directions.

Preferably, an intermediate value of both electric potentials of the bit lines which are applied from the ferroelectric capacitors of both of the dummy memory cells to each of the bit lines corresponding thereto is supplied as a reference potential to the sense amplifier.

For example, the operation to apply the electric potentials from both of the dummy memory cells to each bit line corresponding thereto is executed in a state where both of the second and third bit lines are mutually electrically shut off, and thereafter, an intermediate value of both electric potentials of both of the second and third bit lines which is obtained by the short-circuit of both of the second and third bit lines by the short-circuit means is supplied as a reference potential to the sense amplifier.

The above and other objects and features of the present invention will become apparent from the following detailed description and the appended claims with reference to the accompanying drawings.

DETAILED DESCRIPTION OF THE PREFERRED EMBODIMENTS

Preferred embodiments of a semiconductor memory and its driving method according to the invention will now be described hereinbelow in detail with reference to the drawings. In the following description and drawings, component elements having substantially the same functions and constructions will be designated by the same reference characters and their overlapped description is omitted.

First Embodiment

Figure 1:
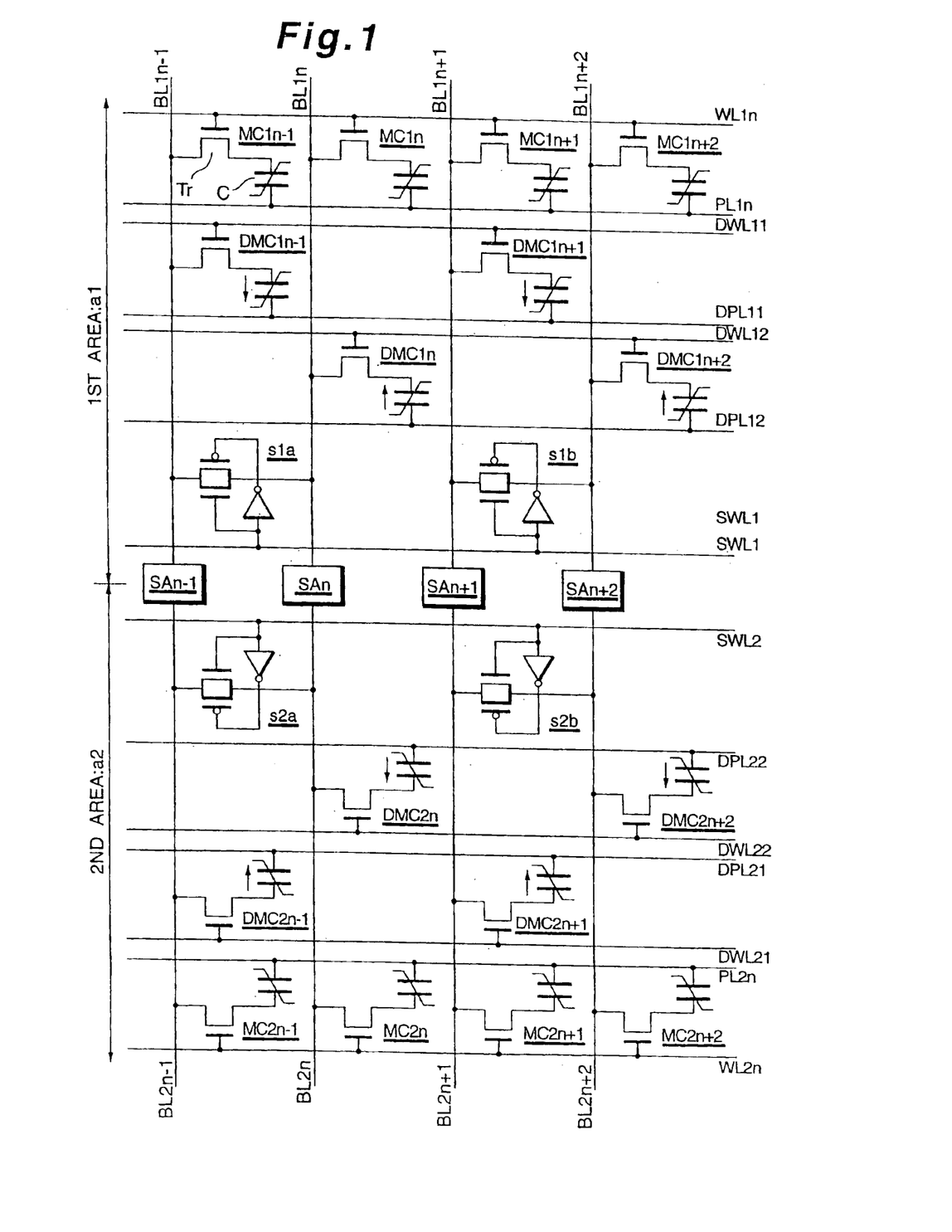
FIG. 1 is a circuit diagram showing a construction of a memory cell array of a ferroelectric memory according to the first embodiment of the invention.

FIG. 1 shows a construction of a memory cell array of a ferroelectric memory according to the first embodiment of the invention.

The memory cell array has a first area a1 and a second area a2. Those areas are arranged so that the circuit constructions are symmetrical so as to sandwich a plurality of sense amplifiers SAn−1, SAn, SAn+1, and SAn+2. A plurality of memory cells MC1n−1, MC1n, MC1n+1, MC1n+2, . . . , dummy memory cells DMC1n−1, DMC1n, DMC1n+1, DMC1n+2, . . . , and short-circuit portions s1a, s1b, . . . are provided in the first area a1, respectively. A plurality of memory cells MC2n−1, MC2n, MC2n+1, MC2n+2, . . . , dummy memory cells DMC2n−1, DMC2n, DMC2n+1; DMC2n+2, . . . , and short-circuit portions s2a, s2b, . . . are provided in the second area a2, respectively.

Each of the memory cells and dummy memory cells is constructed by an n-channel type transistor (hereinafter, referred to as an "N-transistor") Tr and a ferroelectric capacitor C.

A bit line BL1n−1 is connected to a first terminal of the sense amplifier SAn−1 and a bit line BL2n−1 is connected to a second terminal. Similarly, the bit lines BL1n and BL2n are connected to the sense amplifier SAn. Bit lines BL1n+1 and BL2n+1 are connected to the sense amplifier SAn+1. Bit lines BL1n+2 and BL2n+2 are connected to the sense amplifier SAn+2. The bit lines BL1n−1, BL1n, BL1n+1, BL1n+2, . . . are arranged on the first area a1 side and the bit lines BL2n−1, BL2n, BL2n+1, BL2n+2, . . . are arranged on the second area a2 side.

Further, a word line WL1n, a plate line PL1n, dummy word lines DWL11 and DWL12, dummy plate lines DPL11 and DPL12, and a short-circuit portion control line SWL1 are arranged in the first area a1 so as to perpendicularly cross bit lines BL1n−1, BL1n, BL1n+1, and BL1n+2, respectively. A word line WL2n, a plate line PL2n, dummy word lines DWL21 and DWL22, dummy plate lines DPL21 and DPL22, and a short-circuit portion control line SWL2 are arranged in the second area a2 so as to perpendicularly cross bit lines BL2n−1, BL2n, BL2n+1, and BL2n+2, respectively.

Contents of the connection of the circuit component elements of the first area a1 will be first explained.

The memory cells MC1n−1, MC1n, MC1n+1, and MC1n+2 are arranged at the positions where the bit lines BL1n−1, BL1n, BL1n+1, and BL1n+2 and the word line WL1n cross, respectively. For example, the memory cell MC1n is arranged at the crossing position of the bit line BL1n and the word line WL1n. A gate of the N-transistor Tr constructing the memory cell MC1n is connected to the word line WL1n, a source (drain) is connected to the bit line BL1n, and a drain (source) is connected to a first terminal of the ferroelectric capacitor C constructing the memory cell MC1n, respectively. A second terminal of the ferroelectric capacitor C constructing the memory cell MC1n is connected to the plate line PL1n. Second terminals of the ferroelectric capacitors C constructing the other memory cells MC1n−1, MC1n+1, and MC1n+2 are also connected to the plate line PL1n in common.

The dummy memory cells DMC1n−1 and DMC1n+1 are arranged at the positions where the bit lines BL1n−1 and BL1n+1 and the dummy word line DWL11 cross, respectively. The dummy memory cells DMC1n and DMC1n+2 are arranged at the positions where the bit lines BL1n and BL1n+2 and the dummy word line DWL12 cross, respectively. For example, the dummy memory cell DMC1n−1 is arranged at the position where the bit line BL1n−1 and the dummy word line DWL11 cross. A gate of the N-transistor Tr constructing the dummy memory cell DMC1n−1 is connected to the dummy word line DWL11, a source (drain) is connected to the bit line BL1n−1, and a drain (source) is connected to a first terminal of the ferroelectric capacitor C constructing the dummy memory cell DMC1n−1, respectively. The dummy memory cell DMC1n is arranged at the crossing position of the bit line BL1n and the dummy word line DWL12. A gate of the N-transistor Tr constructing the dummy memory cell DMC1n is connected to the dummy word line DWL12, a source (drain) is connected to the bit line BL1n, and a drain (source) is connected to a first terminal of the ferroelectric capacitor C constructing the dummy memory cell DMC1n, respectively. Second terminals of the ferroelectric capacitors C constructing the dummy memory cells DMC1n−1 and DMC1n+1 are connected to the dummy plate line DPL11 in common. Second terminals of the ferroelectric capacitors C constructing the dummy memory cells DMC1n and DMC1n+2 are connected to the dummy plate line DPL12 in common.

The short-circuit portions s1a and s1b are connected to the short-circuit portion control line SWL1. A short-circuit portion control signal SW1 which is transmitted thereto is asserted (H level) and set to the ON state. The short-circuit portion s1a is connected to the bit line BL1n−1 and the bit line BL1n locating at the position adjacent thereto and short-circuits them in the ON state. The short-circuit portion s1b is connected to the bit line BL1n+1 and the bit line. BL1n+2 locating at the position adjacent thereto and short-circuits them in the ON state.

Connection contents of the component elements in the second area a2 will now be described. As mentioned above, the circuit elements belonging to the second area a2 are arranged in a manner similar to those belonging to the first area a1.

The memory cells MC2n−1, MC2n, MC2n+1, and MC2n+2 are arranged at the positions where the bit lines BL2n−1, BL2n, BL2n+1, and BL2n+2 and the word line WL2n cross, respectively. For example, the memory cell MC2n is arranged at the crossing position of the bit line BL2n and the word line WL2n. A gate of the N-transistor Tr constructing the memory cell MC2n is connected to the word line WL2n, a source (drain) is connected to the bit line BL2n, and a drain (source) is connected to a first terminal of the ferroelectric capacitor C constructing the memory cell MC2n, respectively. A second terminal of the ferroelectric capacitor C constructing the memory cell MC2n is connected to the plate line PL2n. Second terminals of the ferroelectric capacitors C constructing the other memory cells MC2n−1, MC2n+1, and MC2n+2 are also connected to the plate line PL2n in common.

The dummy memory cells DMC2n−1 and DMC2n+1 are arranged at the positions where the bit lines BL2n−1 and BL2n+1 and the dummy word line DWL21 cross, respectively. The dummy memory cells DMC2n and DMC2n+2 are arranged at the positions where the bit lines BL2n and BL2n+2 and the dummy word line DWL22 cross, respectively. For example, the dummy memory cell DMC2n−1 is arranged at the crossing position of the bit line BL2n−1 and the dummy word line DWL21. A gate of the N-transistor Tr constructing the dummy memory cell DMC2n−1 is connected to the dummy word line DWL21, a source (drain) is connected to the bit line BL2n−1, and a drain (source) is connected to a first terminal of the ferroelectric capacitor C constructing the dummy memory cell DMC2n−1, respectively. The dummy memory cell DMC2n is arranged at the crossing position of the bit line BL2n and the dummy word line DWL22. A gate of the N-transistor Tr constructing the dummy memory cell DMC2n is connected to the dummy word line DWL22, a source (drain) is connected to the bit line BL2n, and a drain (source) is connected to a first terminal of the ferroelectric capacitor C constructing the dummy memory cell DMC2n, respectively. Second terminals of the ferroelectric capacitors C constructing the dummy memory cells DMC2n−1 and DMC2n+2 are connected to the dummy plate line DPL21 in common. Second terminals of the ferroelectric capacitors C constructing the dummy memory cells DMC2n and DMC2n+2 are connected to the dummy plate line DPL22 in common.

The short-circuit portions s2a and s2b are connected to the short-circuit portion control line SWL2. A short-circuit portion control signal SW2 which is transmitted there is asserted (H level) and set to the ON state. The short-circuit portion s2a is connected to the bit line BL2n−1 and the bit line BL2n locating at the position adjacent thereto and short-circuits them in the ON state. The short-circuit portion s2b is connected to the bit line BL2n+1 and the bit line BL2n+2 locating at the position adjacent thereto and short-circuits them in the ON state.

Besides the word lines WL1n and WL2n, a plurality of word lines are also provided for the first area a1 and second area a2, and a plurality of memory cells are connected to each word line in a manner similar to the word lines WL1n and WL2n (not shown).

Figure 2:
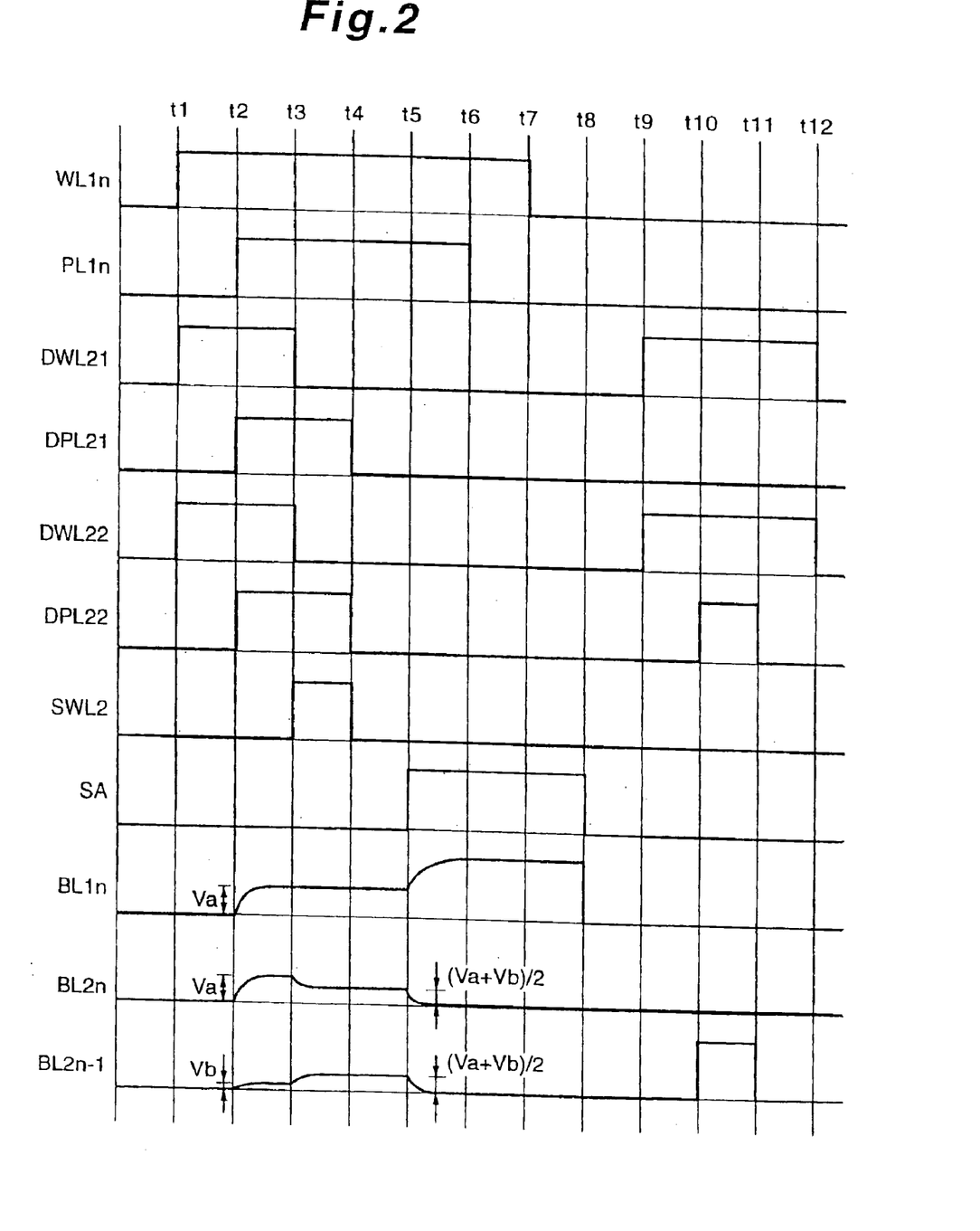
FIG. 2 is a timing chart showing the data reading operation of the ferroelectric memory in FIG. 1.

The data reading operation of the ferroelectric memory constructed as mentioned above will now be described with reference to FIG. 2. A case of reading out the storage data from the memory cells MC1n−1, MC1n, MC1n+1, and MC1n+2 belonging to the first area a1 will be described.

First, all of the bit lines BL1n−1, BL1n, BL1n+1, and BL1n+2 belonging to the first area a1 and all of the bit lines BL2n−1, BL2n, BL2n+1, and BL2n+2 belonging to the second area a2 are precharged to 0V and, thereafter, set to a floating state.
<Time t1>

The word line WL1n belonging to the first area a1 and is concerned with the memory cell as a reading target and the dummy word lines DWL21 and DWL22 belonging to the second area a2 are set to the H level.
<Time t2>

The plate line PL1n belonging to the first area a1 and the dummy plate lines DPL21 and DPL22 belonging to the second area a2 are set to the H level. At this time point, the polarizing state of the ferroelectric capacitors C constructing the memory cells MC1n−1, MC1n, MC1n+1, and MC1n+2, that is, the electric potential according to the stored information is developed in the bit lines BL1n−1, BL1n, BL1n+1, and BL1n+2 belonging to the first area a1, respectively. On the other hand, the electric potential according to the polarizing state of the ferroelectric capacitors C constructing the dummy memory cells DMC2n−1, DMC2n, DMC2n+1, and DMC2n+2 is developed in the bit lines BL2n−1, BL2n, BL2n+1, and BL2n+2 belonging to the second area a2, respectively.

In the first area a1, different opposite information has previously been written in the dummy memory cells DMC1n−1 and DMC1n connected to the bit lines BL1n−1 and BL1n which can be short-circuited by the short-circuit means, that is, the short-circuit portion s1a, respectively. That is, the ferroelectric capacitors C provided for the dummy memory cells DMC1n−1 and DMC1n have been polarized in the opposite directions as shown by arrows in FIG. 1.

Similarly, different opposite information has previously been written in the dummy memory cells DMC1n+1 and DMC1n+2 connected to the bit lines BL1n+1 and BL1n+2 which can be short-circuited by the short-circuit means, that is, the short-circuit portion s1b, respectively. That is, the ferroelectric capacitors C provided for the dummy memory cells DMC1n+1 and DMC1n+2 have been polarized in the opposite directions as shown by arrows in FIG. 1.

Also in the second area a2, similarly, different opposite information has previously been written in the dummy memory cells DMC2n−1 and DMC2n and different opposite information has previously been written in the dummy memory cells DMC2n+1 and DMC2n+2, respectively.
<Time t3>

The dummy word lines DWL21 and DWL22 belonging to the second area a2 are set to the L level. Further, the short-circuit portion control signal SW2 is asserted and the short-circuit portion control line SWL2 is set to the H level. Thus, the short-circuit portion s2a belonging to the second area a2 is turned on and the bit lines BL2n−1 and BL2n are short-circuited and set to an equal electric potential. The short-circuit portion s2b is turned on and the bit lines BL2n+1 and BL2n+2 are short-circuited and set to an equal electric potential.
<Time t4>

The short-circuit portion control signal SW2 is negated and the short-circuit portion control line SWL2 is set to the L level. Thus, the short-circuit of the bit lines BL2n−1 and BL2n which were short-circuited at time t3 is cancelled and both of them are set into an electrically shut-off state. Likewise, the short-circuit of the bit lines BL2n+1 and BL2n+2 which were short-circuited at time t3 is cancelled and both of them are set into an electrically shut-off state. Further, the dummy plate lines DPL21 and DPL22 are set to the L level.
<Time t5>

The sense amplifiers SAn−1, SAn, SAn+1, and SAn+2 are activated. The sense amplifiers SAn−1, SAn, SAn+1, and SAn+2 compare the electric potentials of the bit lines BL1n−1, BL1n, BL1n+1, and BL1n+2 of the first area a1 with the electric potentials of the bit lines BL2n−1, BL2n, BL2n+1, and BL2n+2 of the second area a2 and amplify them. At this time, the electric potentials of the bit lines BL2n−1, BL2n, BL2n+1, and BL2n+2 of the second area a2 are referred as a reference potential Vref to each of the sense amplifiers SAn−1, SAn, SAn+1, and SAn+2, respectively. As a result of the operation of each sense amplifier, the H-level potential or L-level potential is induced to each bit line. The H-level potential or L-level potential induced to each bit line is transferred to the data line (not shown) as storage information read out from the memory cells MC1n−1, MC1n, MC1n+1, and MC1n+2.
<Time t6>

The plate line PL1n belonging to the first area a1 is set to the L level.
<Time t7>

The word line WL1n belonging to the first area a1 is set to the L level.
<Time t8>

The sense amplifiers SAn−1, SAn, SAn+1, and SAn+2 are returned to the inactive state. At this time point, the storage data destroyed by the foregoing reading operation is restored in each of the memory cells MC1n−1, MC1n, MC1n+1, and MC1n+2.

By the operations so far, the data reading operation from the memory cells MC1n−1, MC1n, MC1n+1, and MC1n+2 is completed. After that, at time t9 and subsequent times, with respect to the dummy memory cells DMC2n−1, DMC2n, DMC2n+1, and DMC2n+2 which belong to the second area a2 and were used as a generating source of the reference potential Vref in the data reading operation, the similar destroyed storage data in each of the memory cells MC1n−1, MC1n, MC1n+1, and MC1n+2 is restored.
<Time t9>

The dummy word lines DWL21 and DWL22 belonging to the second area a2 are set to the H level.

<Time t10>

The dummy plate line DPL2n belonging to the second area a2 is set to the H level (the dummy plate line DPL1n is maintained at the L level) and the bit lines BL2n−1 and BL2n+1 are set to the H level (the bit lines BL2n and BL2n+2 are maintained at the L level). Thus, the polarizing direction of the ferroelectric capacitor C which each of the dummy memory cells DMC2n−1, DMC2n, DMC2n+1, and DMC2n+2 has is returned to the states (initial states) shown by the arrows in FIG. 1. At this time point, the polarizing direction of the ferroelectric capacitor C of the dummy memory cell DMC2n−1 and the polarizing direction of the ferroelectric capacitor C of the dummy memory cell DMC2n are the mutually opposite directions, and the polarizing direction of the ferroelectric capacitor C of the dummy memory cell DMC2n+1 and the polarizing direction of the ferroelectric capacitor C of the dummy memory cell DMC2n+2 are the mutually opposite directions.

<Time t11>

The dummy plate line DPL2n is set to the L level and the bit lines BL2n−1 and BL2n+1 are set to the L level.

<Time t12>

The dummy word lines DWL21 and DWL22 are set to the L level.

In this manner, the data reading operation of the ferroelectric memory according to the first embodiment is executed. According to the ferroelectric memory, the stable data reading operation can be performed in spite of the 1T/1C type. A mechanism of this memory will now be described.

Figure 3:
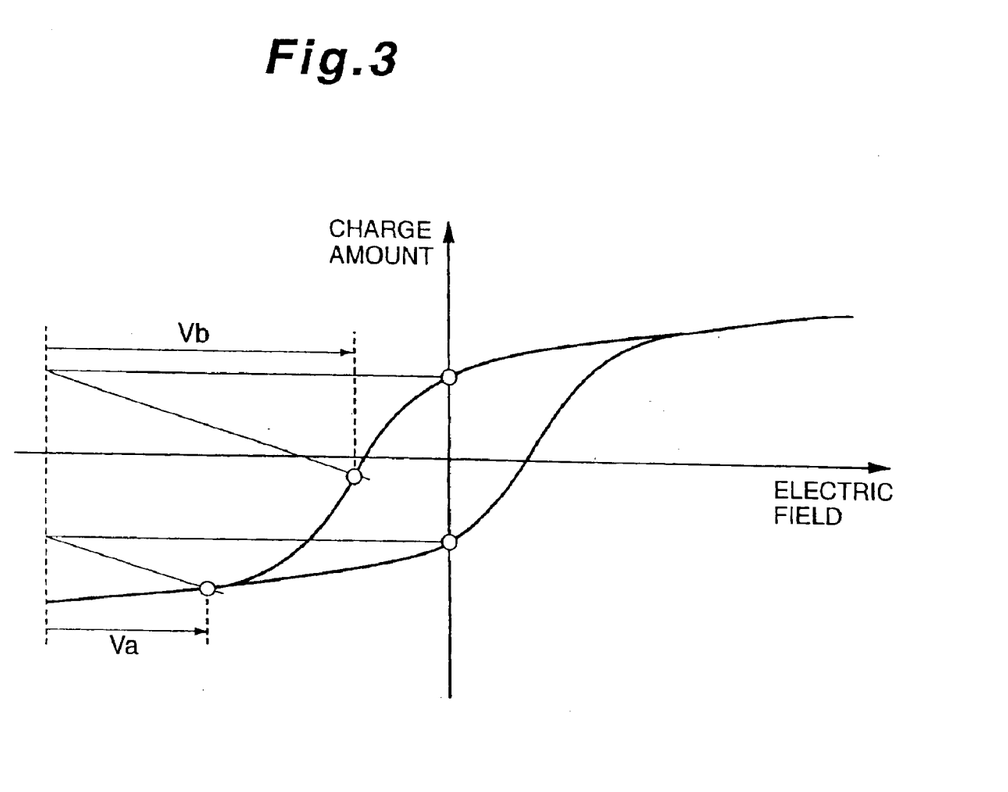
FIG. 3 is a characteristics curve graph showing voltage-charge characteristics of a ferroelectric capacitor.

FIG. 3 shows voltage/charge characteristics of the ferroelectric capacitor constructing each memory cell (including the dummy memory cell). An axis of abscissa indicates a voltage applied to the ferroelectric capacitor and an axis of ordinate indicates an amount of charges charged into the capacitor. Va and Vb denote electric potentials of the bit lines (bit lines BL1n−1, BL1n, BL1n+1, and BL1n+2 here) on the selected memory cell area (first area a1 here) side which are induced by the selected memory cells (memory cells MC1n−1, MC1n, MC1n+1, MC1n+2 here) from which the storage data is read out, respectively.

As mentioned above, according to the ferroelectric memory of the first embodiment, the first area a1 and second area a2 have the circuits with almost the same construction and, further, the component elements of each area, that is, all of the bit lines, memory cells, dummy memory cells, and the like are formed in almost the same size, respectively. As for the bit lines, the bit line capacitances of the first area are equal to those of the second area. As for the memory cells and the dummy memory cells, the capacitances of the ferroelectric capacitors of the first area are equal to those of the second area. Therefore, at time t2, either the electric potential Va or Vb is induced in the bit lines (bit lines BL2n−1, BL2n, BL2n+1, BL2n+2 here) belonging to the reference potential generating area (second area a2 here) in a manner similar to the bit lines in the selected memory cell area.

Since the different opposite information has been stored in the dummy memory cells DMC2n−1 and DMC2n, for example, when the electric potential Va is developed on the bit line BL2n−1 at time t2, the electric potential Vb is developed on the adjacent bit line BL2n. Similarly, since the different opposite information has been stored in the dummy memory cells DMC2n+1 and DMC2n+2, for example, when the electric potential Va is developed on the bit line BL2n−1 at time t2, the electric potential Vb is developed on the adjacent bit line BL2n.

At subsequent time t3, the bit lines BL2n−1 and BL2n are short-circuited by the short-circuit portion s2a. However, since these bit lines have the same capacitance, an electric potential Vave after the short-circuit is set to just an intermediate value (Va+Vb)/2 of the electric potentials Va and Vb. Similarly, an electric potential Vave of the bit lines BL2n+1 and BL2n+2 is also set to the intermediate value (Va+Vb)/2. Since this electric potential Vave always keeps the average value of the electric potentials Va and Vb independent of the manufacturing process and material of the ferroelectric capacitor, it is optimum as a reference potential Vref which is applied to the sense amplifiers SAn−1, SAn, SAn+1, and SAn+2 in order to detect the electric potentials of the bit lines of the selected memory cell area at high precision. That is, since the average voltage value by a pair of both dummy memory cells is used as a reference potential Vref irrespective of a variation of the characteristics of the ferroelectric capacitor of each dummy memory cell, a large variation in reference potential Vref is prevented and an almost constant reference potential can be obtained. Therefore, according to the ferroelectric memory and its driving method of the first embodiment, high reliability can be obtained with respect to the data reading operation in spite of the 1T/1C type. Moreover, since there is no need to preset the value of the reference potential Vref, the design and the manufacturing steps are made easy.

Although the operation of the ferroelectric memory according to the embodiment has been described above with respect to the case of reading out the storage data from the memory cells MC1n−1, MC1n, MC1n+1, and MC1n+2 belonging to the first area a1, the memory of the invention also similarly operates in the case where the storage data is read out from the memory cells MC2n−1, MC2n, MC2n+1, and MC2n+2 belonging to the second area a2. At this time, the dummy memory cells DMC1n−1, DMC1n, DMC1n+1, and DMC1n+2 belonging to the first area a1 are used as a generating source of the reference potential Vref.

Turn-on (short-circuit) timings of the short-circuit portions s1a, s1b, s2a, and s2b for short-circuiting the adjacent bit lines will now be described.

In the data reading operation described with reference to FIG. 2, first, at times t1 and t2, the electric potential Va or Vb is applied to each of the bit lines BL2n−1, BL2n, BL2n+1, and BL2n+2 by the dummy memory cells DMC2n−1, DMC2n, DMC2n+1, and DMC2n+2. After that, the short-circuit portion control line SWL2 is set to the H level at time t3, the bit lines BL2n−1 and BL2n are short-circuited, and the bit lines BL2n+1 and BL2n+2 are short-circuited (method 1).

In place of the above method, after the bit lines BL2n−1 and BL2n were short-circuited and the bit lines BL2n+1 and BL2n+2 were short-circuited, the electric potential can be applied to the bit lines BL2n−1 and BL2n in the short-circuited state and the electric potential can be applied to the bit lines BL2n+1 and BL2n+2 in the short-circuited state by the dummy memory cells DMC2n−1, DMC2n, DMC2n+1, and DMC2n+2 (method 2).

In case of using the method 1, the electric potential of the bit lines of the reference potential generating area is accurately adjusted to the intermediate value of the electric potentials Va and Vb. On the other hand, in case of using the method 2, the electric potential is not always adjusted to the intermediate value. That is, by using the method 1, the data reading precision is further raised. The data reading operation based on the method 2 is shown in FIG. 22 of JP-A-7-93978 mentioned above.

A difference between the bit line electric potentials which are obtained by the methods 1 and 2 will now be described by using the following expressions.

A capacitance of the ferroelectric capacitor of the first dummy memory cell (for example, dummy memory cell DMC2n-1) is assumed to be Cf and a capacitance of the ferroelectric capacitor of the second dummy memory cell (for example, dummy memory cell DMC2n) is assumed to be Cf'. The polarizing direction of the ferroelectric capacitor which the first dummy memory cell has and the polarizing direction of the ferroelectric capacitor which the second dummy memory cell has are the mutually different opposite directions. The capacitances of both capacitors can be regarded as predetermined capacitances Cf and Cf' according to the difference of the polarizing directions.

In case of the method 1, the electric potential is applied to the first bit line (for example, bit line BL2n-1) and the second bit line (for example, bit line BL2n) to which the first dummy memory cell is connected by the first and second dummy memory cells in an open state, that is, in the mutually electrically shut-off state, respectively.

At this time, when the electric potential of the first bit line reaches Va and electric potential of the second bit line reaches Vb, the intermediate value obtained by the short-circuit of them is shown by (Va+Vb)/2.

The intermediate value (Va+Vb)/2 is calculated as follows by using the capacitance Cf of the first ferroelectric capacitor and the capacitance Cf' of the second ferroelectric capacitor.

First, an electric potential Vbl of the first bit line and an electric potential Vbl' of the second bit line before the short-circuit are expressed by the following expressions (1) and (2), respectively. Vpl denotes an electric potential of the plate line and Cb indicates a parasitic capacitance of each bit line.

$$Vbl = Cf \cdot Vpl/(Cf+Cb) \quad (1)$$

$$Vbl' = Cf' \cdot Vpl/(Cf'+Cb) \quad (2)$$

By short-circuiting the first and second bit lines, an electric potential V of both bit lines is equal to an addition mean value of the expressions (1) and (2), so that V is obtained by the following expression (3).

$$V = \frac{1}{2} \cdot Vpl \cdot ((Cf/(Cf+Cb)) + Cf'/(CF'+Cb)) \quad (3)$$

On the other hand, in case of the method 2, a voltage is applied by the first and second dummy memory cells on the basis of the electric potentials of the first and second bit lines which have already been in the short-circuited state. A synthetic capacitance of the ferroelectric capacitors which the respective dummy memory cells have is equal to Cf+Cf'. A synthetic capacitance of the first and second bit lines is equal to 2·Cb. Therefore, an electric potential V' of both of the short-circuited bit lines is shown by the following expression (4).

$$V' = (Cf+Cf') \cdot V/(Cf+Cf'+2 \cdot Cb) \quad (4)$$

This expression (4) differs from the expression (3). The dissidence of the expressions (3) and (4) denotes that in case of using the method 2, the electric potential of the first and second bit lines in the mutually short-circuited state does not coincide with the intermediate value (Va+Vb)/2 of the electric potentials Va and Vb.

Further, the ferroelectric memory according to the first embodiment has the following advantages. The memory cell array of the ferroelectric memory has a feature such that the selected memory cell area (first area a1 here) and the reference potential generating area (second area a2 here) are arranged on both sides of the sense amplifier. According to this construction, the operation to read out the data to the bit line from the selected memory cell belonging to the selected memory cell area side and the operation to read out the data to the bit line from the dummy memory cell in the reference potential generating area can be simultaneously progressed. Therefore, the data reading time can be reduced.

In the memory cell array of the ferroelectric memory according to the first embodiment, two bit lines which are short-circuited by one short-circuit portion are arranged at the adjacent positions. Therefore, the short-circuit portion can be arranged between the two bit lines. Thus, the circuit construction is simplified and the yield in manufacturing of the memories is also improved.

Second Embodiment

As described above, according to the data reading operation of the ferroelectric memory according to the embodiment of the invention, at the final stage, data is rewritten into the dummy memory cells used as a generating source of the reference potential Vref.

In the data reading operation of the ferroelectric memory according to the first embodiment, the same data as the data which has previously been stored in each dummy memory cell is written into each dummy memory cell every data reading operation. This operation will be specifically explained.

The ferroelectric capacitors C of the dummy memory cells DMC2n-1, DMC2n, DMC2n+1, and DMC2n+2 belonging to the second area a2 are preliminarily polarized to the alternately opposite directions (↓↑↓↑ directions) as mentioned above, respectively. These dummy memory cells are used as a generating source of the reference potential Vref and the storage data is read out from the memory cells MC1n-1, MC1n, MC1n+1, and MC1n+2 belonging to the first area a1. After that, at time t9 and subsequent times, the ferroelectric capacitors C which the dummy memory cells have are polarized again to the directions (↓↑↓↑ directions) which coincide with the initial states, respectively.

As mentioned above, according to the data reading operation of the ferroelectric capacitors of the first embodiment, the ferroelectric capacitors C which the dummy memory cells have are polarized to the same directions as the initial states without being reversed each time the data reading operation is performed, respectively.

On the other hand, the polarizing directions of the ferroelectric capacitors which the dummy memory cells used as a generating source of the reference potential Vref have can be also reversed every time at the final stage of the data reading operation. The operation of the ferroelectric memory in case of using this method will be described hereinbelow with reference to FIG. 4. In a manner similar to the first embodiment, explanation will be made in accordance with the case of reading the storage data from the memory cells MC1n-1, MC1n, MC1n+1, and MC1n+2 belonging to the first area a1.

<Time t1 to t8>

Figure 4:
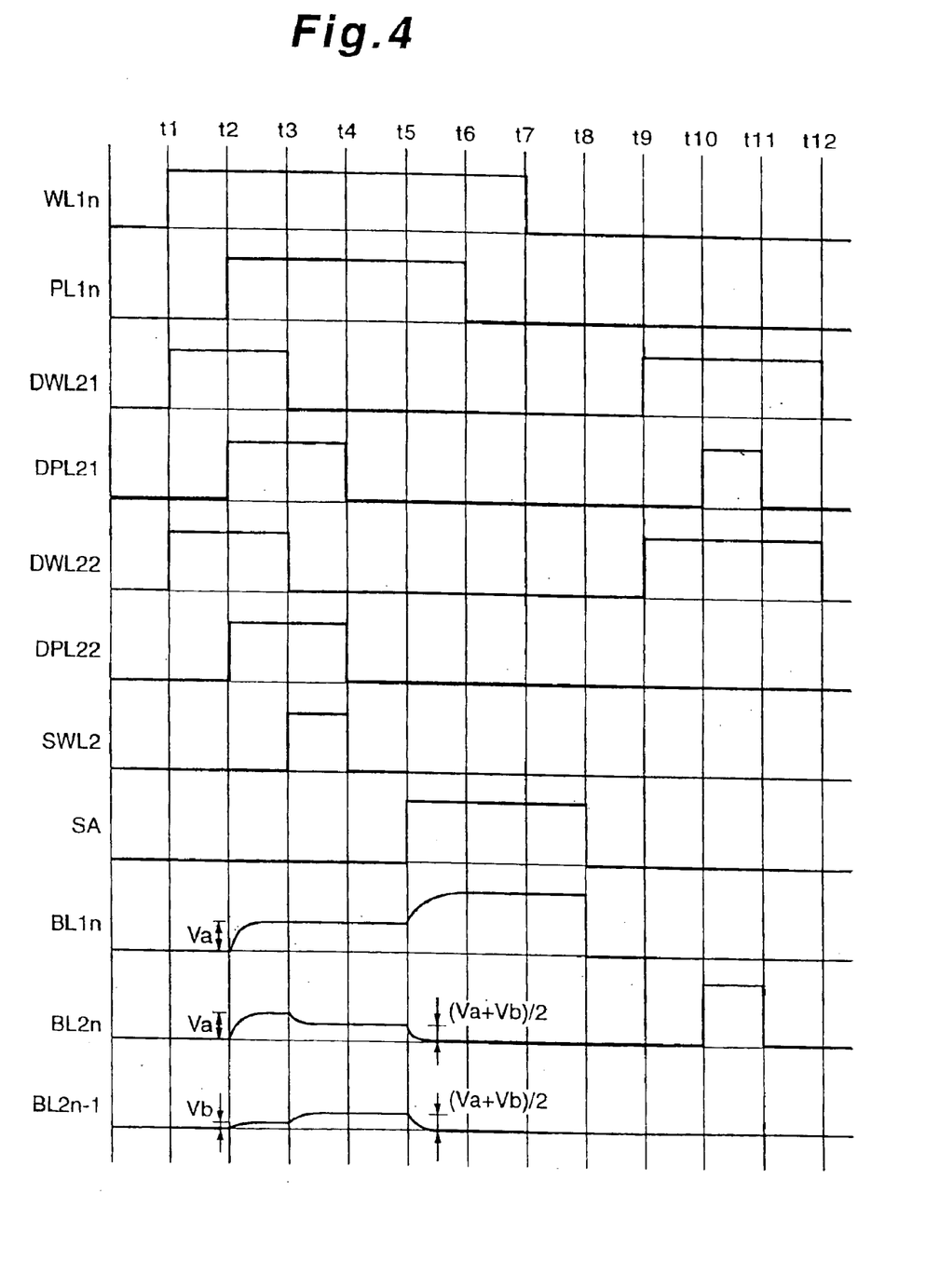
FIG. 4 is a timing chart showing the data reading operation of a ferroelectric memory according to the second embodiment of the invention.

As shown in FIG. 4, the data reading operation from the memory cells MC1n-1, MC1n, MC1n+1, and MC1n+2 and the data restoring operation of each memory cell which is executed in a time interval from time t1 to time t8 are similar to the data reading operation described with reference to FIG. 2.

By the operation which is executed until time t8, the data reading operation from the memory cells MC1n-1, MC1n, MC1n+1, and MC1n+2 is completed. After that, with respect to the dummy memory cells DMC2n-1, DMC2n, DMC2n+

1, and DMC2n+2 which belong to the second area a2 and are used for the data reading operations, the rewriting operation of the storage data is executed. In this instance, however, the data in the initial state stored in each dummy memory cell at a point when the data reading operation is started is not rewritten but the data of opposite logics is written. Subsequently, the data rewriting operation into the dummy memory cells DMC2n−1, DMC2n, DMC2n+1, and DMC2n+2 will be described.

<Time t9>

The dummy word lines DWL21 and DWL22 belonging to the second area a2 are set to the H level.

<Time t10>

The dummy plate line DPL1n belonging to the second area a2 is set to the H level (dummy plate line DPL2n is maintained at the L level) and the bit lines BL2n and BL2n+2 are set to the H level (bit lines BL2n−1 and BL2n+1 are maintained at the L level). Thus, the polarizing directions of the ferroelectric capacitors C which the dummy memory cells DMC2n−1, DMC2n, DMC2n+1, and DMC2n+2 have are opposite to the directions of the arrows shown in FIG. 1, respectively. At this point of time, the polarizing direction of the ferroelectric capacitor C of the dummy memory cell DMC2n−1 and the polarizing direction of the ferroelectric capacitor C of the dummy memory cell DMC2n are opposite, and the polarizing direction of the ferroelectric capacitor C of the dummy memory cell DMC2n+1 and the polarizing direction of the ferroelectric capacitor C of the dummy memory cell DMC2n+2 are opposite. This point shall also apply to the data writing operation described in conjunction with FIG. 2.

As mentioned above, according to the data reading operation in the second embodiment, at time t10, in the reference potential generating area (second area a2 here), with respect to the dummy plate lines and bit lines whose potential levels are shifted, the polarizing directions change every data reading operation. The specific operation is as follows.

Consideration will now be made with respect to a case where at time t10 of a certain data reading operation, the dummy plate line DPL2n belonging to the second area a2 is set to the H level (dummy plate line DPL1n is maintained at the L level), the bit lines BL2n−1 and BL2n+1 are set to the H level (bit lines BL2n and BL2n+2 are maintained at the L level), and the polarizing directions of the ferroelectric capacitors C which the dummy memory cells DMC2n−1, DMC2n, DMC2n+1, and DMC2n+2 have are set to the alternately opposite directions (↓↑↓↑ directions) as shown in FIG. 1, respectively.

After that, when the data reading operation using the dummy memory cells DMC2n−1, DMC2n, DMC2n+1, and DMC2n+2 as a generating source of the reference potential Vref is executed, at time t10, the dummy plate line DPL1n is set to the H level (dummy plate line DPL2n is maintained at the L level) and the bit lines BL2 and BL2n+2 are set to the H level (bit lines BL2n−1 and BL2n+1 are maintained at the L level). Thus, the polarizing directions of the ferroelectric capacitors C which the dummy memory cells DMC2n−1, DMC2n, DMC2n+1, and DMC2n+2 have are reversed from the initial states and are set to the alternately opposite directions (↑↓↑↓ directions), respectively. After that, in a manner similar to the above, the polarizing directions of the ferroelectric capacitors of the dummy memory cells are sequentially reversed every data reading operation.

<Time t11>

The dummy plate line DPL1n (or the dummy plate line DPL2n) is set to the L level and the bit lines BL2n and BL2n+2 (or the bit lines BL2n−1 and BL2n+1) are set to the L level, respectively.

<Time t12>

The dummy word lines DWL21 and DWL22 are set to the L level.

The data reading operation of the ferroelectric memory according to the second embodiment is executed as mentioned above. According to the data reading operation, the data can be stably read out in a manner similar to the data reading operation according to the first embodiment.

When the voltage only in one direction is repetitively applied to the ferroelectric capacitor, what is called an imprint phenomenon occurs due to deterioration of hysteresis characteristics of the ferroelectric substance and a possibility that erroneous data is read out rises. With respect to this point,-according to the data reading operation of the second embodiment, each time the data reading operation is repeated, the polarizing directions of the ferroelectric capacitors which the dummy memory cells have are reversed, so that the occurrence of the imprint phenomenon is prevented. Therefore, the reliability of the ferroelectric memory is further improved.

Although the preferred embodiments of the invention have been described above with reference to the drawings, the invention is not limited to those embodiments. Naturally, those skilled in the art will be able to presume many variations and modifications within the purview of the technical idea disclosed in the scope of Claims of the invention. It will be understood that those variations and modifications are obviously within the technical scope of the invention.

As described above, according to the semiconductor memory and its driving method of the invention, while the memory cell array comprising the memory cells having the ferroelectric capacitors is constructed as a 1T/1C type, the data reading operation of high precision can be guaranteed. Moreover, since there is no need to preset the value of the reference potential, the semiconductor memories can be easily designed and manufactured. Further, according to the semiconductor memory and its driving method of the invention, the occurrence of the imprint phenomenon is prevented. Therefore, the reliability of the semiconductor memory is further improved.

What is claimed is:

1. A semiconductor memory comprising:

a memory cell having ferroelectric capacitor which is selectively connected to a first bit line through a switching device;

a sense amplifier for comparing an electric potential of said first bit line with a reference potential in order to read out data in said memory cell when said memory cell is connected to said first bit line through said switching device;

first and second dummy memory cells having ferroelectric capacitors which are selectively connected to a second bit line and a third bit line through switching devices in order to apply said reference potential to said sense amplifier; and short-circuit means which short-circuits said second and third bit lines at the time of said data reading, wherein said ferroelectric capacitors of both of said dummy memory cells are polarized to opposite directions relative to one another, and wherein, when the data is read out, the operation to apply the electric potentials from both of said dummy memory cells to each bit line corresponding thereto is executed in a state where both of said second and third bit lines are mutually electrically shut off, and thereafter, an intermediate value of both electric potentials of both of said second and third bit lines which is obtained by said short-circuit of both of said second and third bit lines by said short-circuit means is supplied as the reference potential to said sense amplifier.

2. A memory according to claim 1, wherein the polarizing directions of said ferroelectric capacitors of both of said dummy memory cells are sequentially reversed to opposite directions every said data reading.

3. A semiconductor memory comprising:
- a memory cell having ferroelectric capacitor which is selectively connected to a first bit line through a switching device;
- a sense amplifier for comparing an electric potential of said first bit line with a reference potential in order to read out data in said memory cell when said memory cell is connected to said first bit line through said switching device;
- first and second dummy memory cells having ferroelectric capacitors which are selectively connected to a second bit line and a third bit line through switching devices in order to apply said reference potential to said sense amplifier; and
- short-circuit means which short-circuits said second and third bit lines at the time of said data reading,
- wherein said ferroelectric capacitors of both of said dummy memory cells are polarized to opposite directions relative to one another, and
- wherein each time the data is read out, the polarizing directions of said ferroelectric capacitors of both of said dummy memory cells are sequentially reversed to opposite directions.

4. A memory according to claim 3, wherein an intermediate value of both electric potentials of said bit lines which are applied from said ferroelectric capacitors of both of said dummy memory cells to each of said bit lines corresponding thereto is supplied as a reference potential to said sense amplifier.

5. A memory according to claim 3, wherein the operation to apply the electric potentials from both of said dummy memory cells to each bit line corresponding thereto is executed in a state where both of said second and third bit lines are mutually electrically shut off, and thereafter, an intermediate value of both electric potentials of both of said second and third bit lines which is obtained by the short-circuit of both of said second and third bit lines by said short-circuit means is supplied as a reference potential to said sense amplifier.

6. A semiconductor memory, comprising:
first, second and third bit lines:
- a first memory cell which induces a first electric potential onto the first bit line;
- a first dummy memory cell having a ferroelectric capacitor polarized to a first direction and inducing a second electric potential onto the second bit line;
- a second dummy memory cell having a ferroelectric capacitor polarized to a second direction opposite to said first direction and inducing a third electric potential onto the third bit line;
- a short-circuiting device which electrically shorts said second and third bit lines;
- a sense amplifier which compares an electric potential of said first bit line with an electric potential of said second bit line and outputs an amplified voltage to each of said first and second bit lines in accordance with a result of said comparison.

7. The method according to claim 6, wherein the first bit line is one of a plurality of bit lines located in a first area of the semiconductor memory, and the second and third bit lines are two of a plurality of bit lines located in a second area of the semiconductor memory.

8. The method according to claim 7, further comprising a second memory cell which induces a fourth electric potential onto a fourth bit line.

9. The method according to claim 8, further comprising a third dummy memory cell having a ferroelectric capacitor polarized to the first direction and inducing a fifth electric potential onto a fifth bit line.

10. The method according to claim 9, further comprising a fourth dummy memory cell having a ferroelectric capacitor polarized to a second direction opposite to said first direction and inducing a sixth electric potential onto a sixth bit line.

11. The method according to claim 10, further comprising a second short-circuiting device which electrically shorts said fifth and sixth bit lines.

12. The method according to claim 11, further comprising a second sense amplifier which compares an electric potential of said fourth bit line with an electric potential of said fifth bit line and outputs an amplified voltage to each of said fourth and fifth bit lines in accordance with a result of said comparison.

* * * * *